United States Patent
Lim et al.

(10) Patent No.: US 10,446,457 B2
(45) Date of Patent: Oct. 15, 2019

(54) MULTI-LAYER SUBSTRATE FOR SEMICONDUCTOR PACKAGING

(71) Applicant: Advanpack Solutions Pte Ltd, Singapore (SG)

(72) Inventors: Shoa Siong Lim, Singapore (SG); Hwee Seng Chew, Singapore (SG)

(73) Assignee: Advanpack Solutions Pte Ltd, Singapore (SG)

( * ) Notice: Subject to any disclaimer, the term of this patent is extended or adjusted under 35 U.S.C. 154(b) by 0 days.

(21) Appl. No.: 16/032,085

(22) Filed: Jul. 11, 2018

(65) Prior Publication Data

US 2018/0323121 A1    Nov. 8, 2018

Related U.S. Application Data

(62) Division of application No. 14/387,843, filed as application No. PCT/SG2013/000119 on Mar. 26, 2013, now Pat. No. 10,049,950.

(60) Provisional application No. 61/615,399, filed on Mar. 26, 2012.

(51) Int. Cl.
| | |
|---|---|
| *H01L 21/48* | (2006.01) |
| *H01L 23/12* | (2006.01) |
| *H01L 23/498* | (2006.01) |
| *H01L 23/00* | (2006.01) |
| *H01L 21/56* | (2006.01) |
| *H01L 23/29* | (2006.01) |
| *H01L 23/13* | (2006.01) |

(52) U.S. Cl.
CPC .......... *H01L 23/12* (2013.01); *H01L 21/4842* (2013.01); *H01L 21/4857* (2013.01); *H01L 21/56* (2013.01); *H01L 23/295* (2013.01); *H01L 23/49822* (2013.01); *H01L 23/49838* (2013.01); *H01L 24/97* (2013.01); *H01L 23/13* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/97* (2013.01); *H01L 2924/12042* (2013.01); *H01L 2924/15311* (2013.01); *H01L 2924/15747* (2013.01); *H01L 2924/181* (2013.01); *Y10T 29/49121* (2015.01)

(58) Field of Classification Search
CPC ..................................................... H01L 23/296
See application file for complete search history.

(56) References Cited

U.S. PATENT DOCUMENTS

| | | | | |
|---|---|---|---|---|
| 6,262,376 B1* | 7/2001 | Hurwitz | ............... | H01L 21/4846 174/255 |
| 2003/0111734 A1* | 6/2003 | Kobayashi | ............... | H01L 23/24 257/774 |
| 2009/0212421 A1* | 8/2009 | Shah | ................. | H01L 21/02118 257/737 |

* cited by examiner

*Primary Examiner* — Michael Carter
(74) *Attorney, Agent, or Firm* — Pyprus Pte Ltd

(57) ABSTRACT

The present invention provides a semiconductor substrate (105, 105a) comprising two or more layers of built-up structural layers (120, 220) formed on a sacrificial carrier (110). Each built-up structural layer, comprising a conductor trace layer (114a,) and an interconnect (118a, 218a), is molded in a resin molding compound. A top surface of the molded compound is abrasively ground and then deposited with an adhesion layer (123, 124, 224). A multi-layer substrate (105, 105a) is then obtained after an outermost conductor trace layer (128a, 228a) is formed on the adhesion layer and the carrier (110) or reinforcing ring (110b) is removed.

6 Claims, 7 Drawing Sheets

MULTI-LAYER SUBSTRATE FOR SEMICONDUCTOR PACKAGING

CROSS-REFERENCE TO RELATED APPLICATIONS

This application is a divisional of U.S. patent application Ser. No. 14/387,843, filed Sep. 25, 2014, which is a National Stage of International Application No. PCT/SG2013/000119, filed Mar. 26, 2013, which claims the benefit of Provisional Application No. 61/615,399, filed Mar. 26, 2012.

FIELD OF INVENTION

The present invention relates to multi-layer substrates for semiconductor packaging and methods of manufacturing such substrates.

BACKGROUND

Conventional semiconductor dies are mounted on leadframes. These leadframes are usually formed by coating a copper substrate with a photoresist layer, exposing a pattern on the photoresist layer using a mask, positively or negatively removing the photoresist layer and then etching away the copper to give a patterned leadframe. However, such a patterned leadframe formed by etching is not suitable for use with dies that require finer and closer interconnecting traces than conventional leadframe. Etching inherently causes undercutting and fine conductive traces thus formed may have reliability issue for high throughput manufacturing.

U.S. Pat. No. 7,795,071, assigned to Advanpack Solutions, describes a method for forming a single-layer patterned substrate for semiconductor packaging. A gang of patterned conductor layouts is formed on a steel carrier, and insulating material is injected in a mold to seal the conductive traces. After removing the steel carrier, a substrate containing a gang of patterned conductor layouts, is formed. Advantageously, the patterned conductor layouts are electrically isolated from each other, whereas on a conventional leadframe, each conductor layout corresponding to each die is electrically connected to an adjacent layout.

It can thus be seen that there exists a need to form a multi-layer substrate with more complex routing of conductive traces to support future designs of integrated circuits. Advantageously, these multi-layer substrates allow separate conductor layers to be used for signal, power, digital, analogue circuits and so on.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

The present invention seeks to provide substrates containing two or more built-up structural layers formed on a sacrificial carrier. Each built-up structural layer comprises a conductor trace layer and an interconnect layer. Each built-up structural layer is molded in a resin compound. The multi-layer substrate is then completed by forming an outermost conductor trace layer and removing the carrier.

In one embodiment, the present invention provides a multi-layer substrate comprising: a sacrificial carrier that is electrically conductive and chemically etchable; a first conductor trace layer formed on the sacrificial carrier; a second conductor trace layer and an interconnect layer disposed between the first and second conductor trace layers, wherein studs connect selected areas between the first and second conductor trace layers.

In one embodiment of the multi-layer substrate, the first conductor trace layer and interconnect layers are encapsulated in a resin molding compound. The top surface of the resin molding is abrasively ground and an adhesion layer is deposited on the ground surface. The adhesion layer may be a conductor seed layer, a polyimide layer or a woven glass fiber laminate. The multi-layer substrate thus comprises two or more built-up layers, each of the built-up layer is made up of a conductor trace layer, an interconnect layer and an adhesion layer, such that the outermost layer is a conductor trace layer.

In another embodiment, the present invention provides a method for manufacturing multi-layer semiconductor substrates. The method comprises: forming a first conductor trace layer on a sacrificial carrier, wherein the first conductor trace layer contains a plurality of conductor layouts; forming an interconnect layer on the first conductor trace layer, wherein the interconnect layer comprises studs that connect with selected areas of the first conductor trace layer; encapsulating the first conductor trace and interconnect layers in a resin molding compound; abrasively grinding a surface of the molded encapsulation for planarity and to expose the interconnect studs; depositing an adhesion layer on the ground encapsulation surface; repeating the above steps to form an additional built-up structure of the multi-layer substrate so that there are 2 or more built-up structural layers; and forming an outermost conductor trace layer on the top adhesion layer.

In another embodiment, the method further comprises: sealing the outermost conductor trace layer with an insulating layer; selectively removing the insulating layer to expose areas of the outermost conductor trace layer for external electrical connection.

Preferably, an internal portion of the carrier is removed to leave a reinforcing ring around the substrate or a gang of conductor layouts contained in the first conductor trace layer. Preferably, the first conductor trace layer is sealed with a soldermask and selective removal of the solder mask exposes areas on the first conductor trace layer for external electrical connection.

BRIEF DESCRIPTION OF THE DRAWINGS

This invention will be described by way of non-limiting embodiments of the present invention, with reference to the accompanying drawings, in which.

DETAILED DESCRIPTION

Figure 1A:
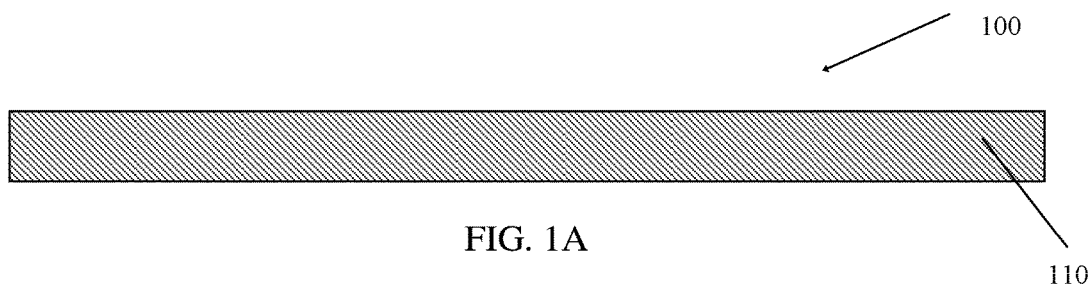
FIGS. 1A-1J illustrate structures of a two-layer substrate according to an embodiment of the present invention.

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

FIGS. 1A-1J show progressive build-up of a multi-layer substrate 105 comprising two conductor trace layers according to an embodiment of the present invention. As shown in FIG. 1A, the first step in the process 100 is to provide a carrier 110 having a first surface and an opposite facing second surface. Preferably, the carrier 110 is made of a low-cost material having high Young's modulus of elasticity, is electrically conductive and is suitable for chemical etching, such as steel. These properties of the carrier 110 allow it to be sacrificially removed partially during fabrication of the multi-layer substrate 105 and/or completely after a semiconductor die 10 is encapsulated. Preferably, the carrier 110 is stress-relieved or partially stress-relieved, for example, by annealing.

Figure 1B:
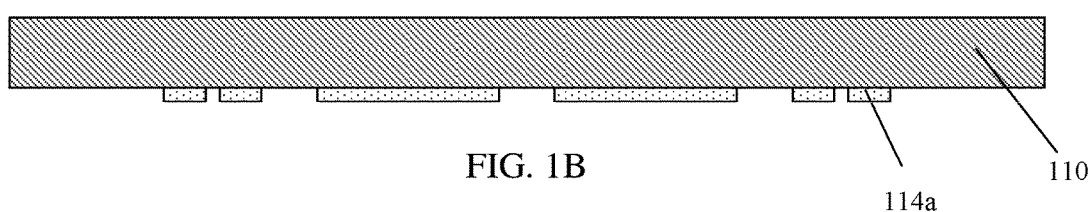
Figure 1C:
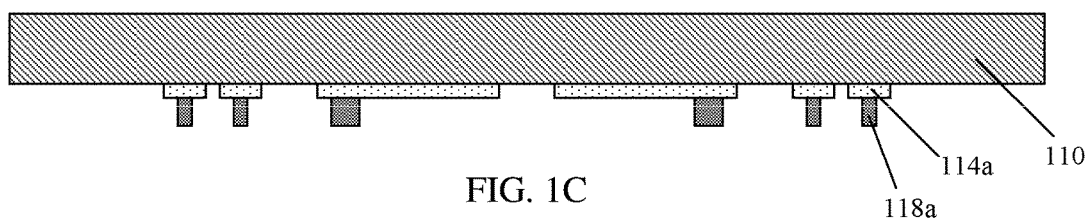
Figure 1D:
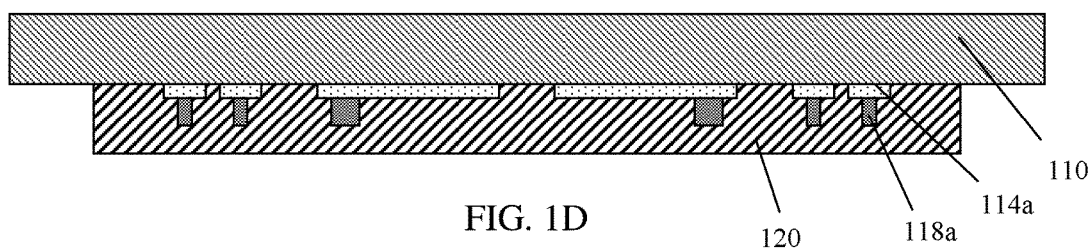

Subsequent process steps involve coating a surface of the carrier 110 with a photoresist, exposing the photoresist with a mask, selectively etching away the photoresist, and obtaining a patterned photoresist. By depositing a first electric conductor material 114, such as copper, over the patterned photoresist and then removing the photoresist, a patterned first conductor trace layer 114a is formed on the carrier 110. The patterned first conductor trace layer 114a thus contains a plurality of first conductor layouts for connection with some semiconductor dies. Preferably, the first conductor material 114 is copper and a suitable depositing process is electroplating. FIG. 1B shows an enlarged part of a section through the first conductor trace layer 114a. For easier referencing, the patterned first conductor trace layer and the first conductor layouts are identified by the same reference numeral 114a. By similar photolithographic process and by depositing a second electric conductor material 118 on a resulting patterned photoresist defining interconnecting vias, a first interconnect layer 118a made up of conductor studs 118 is thus formed on the first conductor trace layer 114a, as shown in FIG. 1C. Alternatively, the first conductor trace layer 114a and first interconnect layer 118a are formed by subtractive photolithographic processes. Various combinations of additive, semi-additive or semi-subtractive processes can be adopted to create the required patterned structure. To electrically isolate the conductor traces and to encase the conductor traces/studs in an insulating material, a gang of the first conductor layouts 114a and conductor studs 118a is disposed in a cavity or gangs of the first conductor layouts 114a and conductor studs 118a are disposed in a plurality of cavities. An insulating or dielectric molding compound, preferably preheated to a fluid state, is injected into the cavity or cavities at a melt temperature. Preferably, the fluid molding compound is injected at a positive pressure so that the molding compound is densely packed with the gang of the first conductor layouts 114a and conductor studs 118a to form a compact composite structure or a first insulator layer 120 after the molding compound has solidified; as a result, the molding compound bonds strongly onto the first conductor layouts 114a and conductor studs 118a such that during wet processing, fluid cannot enter the conductor-molding compound interfaces. A semi-finished substrate, as shown in FIG. 1D, is thus obtained. Preferably, the first insulator layer 120 comprises a molding compound containing a matrix of resin and silica fillers. Preferably, after the first insulator layer 120 is formed, the silica fillers are embedded within the resin.

Figure 1E:
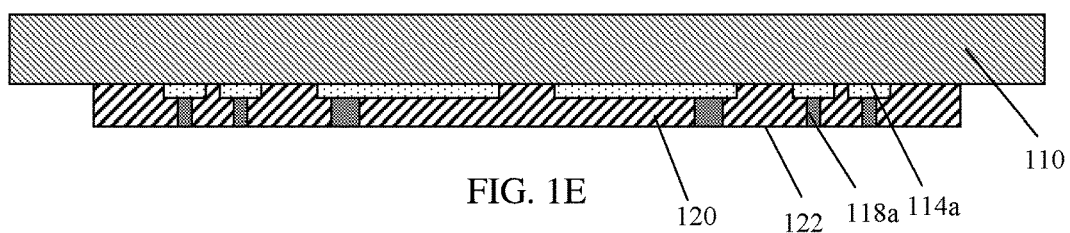
Figure 1F:
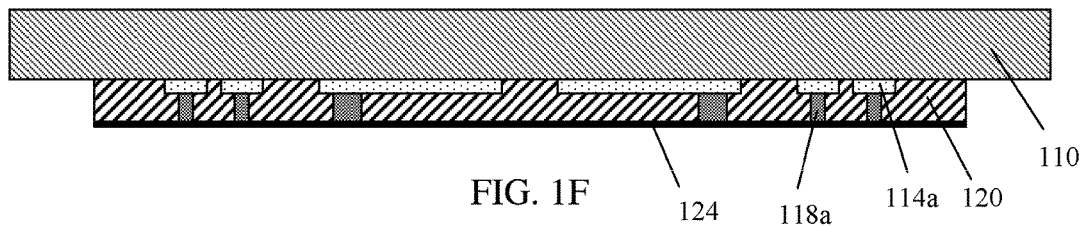

The semi-finished substrates shown in FIG. 1D are moved to a machining centre and the free surface of the first insulator layer 120 is made planar by abrasive grinding, to a depth when all the conductor studs 118a are exposed on the ground surface 122, as shown in FIG. 1E. Preferably, the exposed surfaces of the conductor studs 118a are leveled with or recessed in the rear surface of the first insulating layer 120 (as seen in FIG. 1E) such that the first insulating layer 120 defines the edges of the conductor studs and isolates the conductor studs one from one another. After grinding, the silica fillers in the molding compound are also exposed. Specifically, the ground surface 122 now comprises resin interposed with silica fillers; the ground surface 122 was found to provide strong adhesion for depositing a conductor seed layer 124, as shown in FIG. 1F. Alternatively, by increasing the rate of material removal during abrasive grinding, the surface silica fillers are extracted from the resin to form a plurality of dimples on the ground surface 122. The dimpled ground surface 122 provides an increased surface area to improve adhesion buildup of the next adjacent layer. When the first conductor material 114 is copper, the conductor seed 124 material is also copper. Suitable methods for depositing the copper seed layer 124 are electroless plating, electrolytic plating, sputtering, CVD or PVD.

Figure 1G:
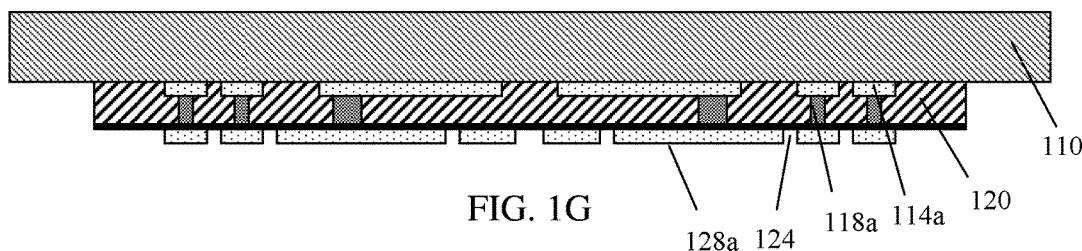

By using the photolithographic process, a patterned photoresist is then formed on the conductor seed layer 124 and by electroplating copper on the patterned photoresist, a patterned second conductor trace layer 128a is obtained, as shown in FIG. 1G. The second conductor trace layer 128a is made up of a plurality of second conductor layouts 128a; each of these second conductor layouts 128a is therefore electrically connected to each of the associated first conductor layouts 114a through the associated first conductor studs 118a.

Figure 1H:
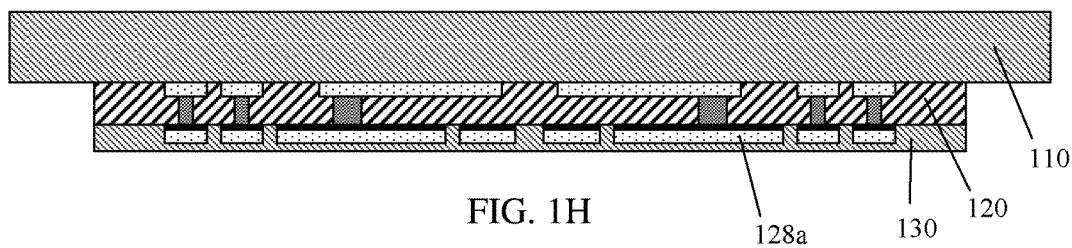
Figure 1I:
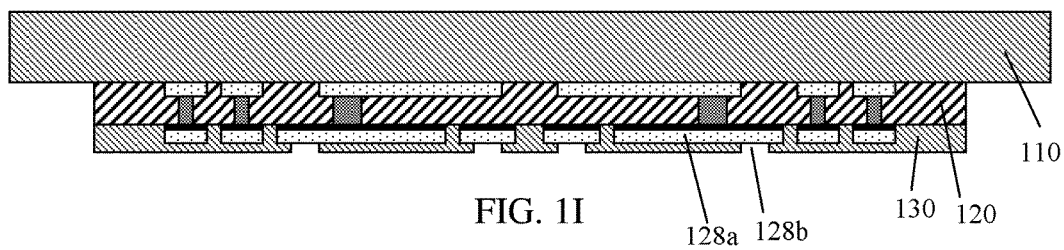

As shown in FIG. 1H, the patterned second conductor trace layer 128a is completed by sealing it with a second insulating or dielectric layer 130. Preferably, the second insulating layer 130 is a soldermask containing a photo imageable polymer material. Preferably, the second insulating layer 130 is screen printed onto the patterned second conductor trace layer 128a. The second insulating layer 130 is then exposed to radiation, such as laser radiation, through a mask, and by selective removal, selected areas 128b of the second conductor trace layer 128a are exposed for external electrical connection, as shown in FIG. 1I. Further processing on the exposed second conductor trace layer 128b for solderability may include depositing a tin layer or a nickel/gold layer.

Figure 1J:
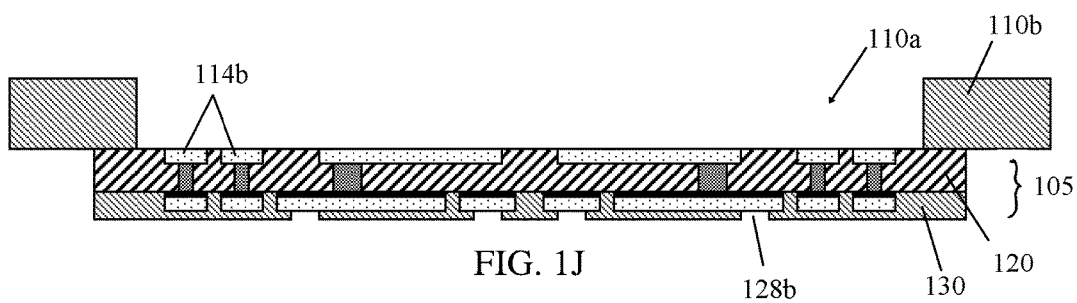
Figure 8:
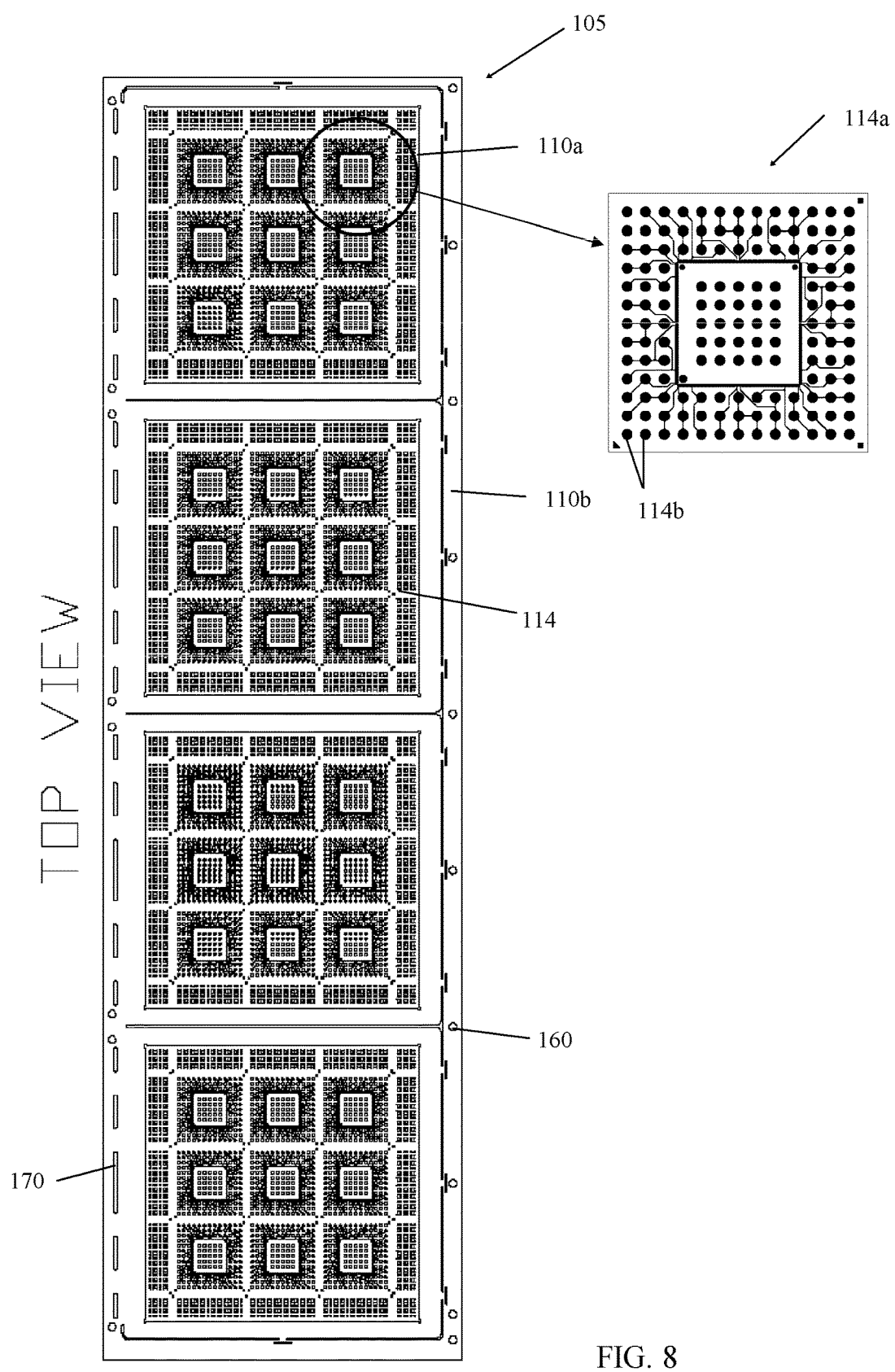
FIG. 8 illustrates a plan view of a finished substrate obtained according to the present invention.

As shown in FIG. 1I, the carrier 110 is larger than the molded first insulator layer 120. Advantageously, an internal portion 110a of the carrier 110 is partially sacrificed and removed, for example by etching, so that a ring 110b remains and a finished substrate 105 is obtained, as shown in FIG. 1J. After removing the carrier 110, the first conductor layouts 114a are exposed together with the surface of the first insulator layer 120. Preferably, the surfaces of the first conductor layouts 114a are leveled or recessed in the top surface of the first insulator layer 120 (as seen in FIG. 1J) such that insulator layer 120 defines the edges of the first conductor layouts 114a and isolates a first conductor layout from one another. As described above, the carrier 110 is made from a material with high Young's modulus and is stress-relieved; by leaving a ring 110b of the carrier on the substrate 105, the carrier ring 110b helps to maintain planarity of the finished substrate 105, at the same time, providing rigidity to the finished substrate 105 for handling and subsequent manufacturing. In another embodiment, the internal opening 110a is smaller than a gang of molded first insulator layers 120 so that a plurality of openings 110a are formed on the carrier 110, instead of just leaving a carrier ring around the entire substrate. In addition, in the peripheral area outside the molded area 120, the carrier ring 110b is formed with positioning or fiducial holes 160 (as seen in FIG. 8); in addition, if the carrier 110 is not stress-relieved before use, stress-relief slots 170 (shown in FIG. 8) may be stamped or formed in the peripheral area before the internal portions 110a are etched away. Advantageously, the peripheral area of the carrier with positioning/fiducial holes or stress-relieved slots defines the clamping area for the above injection or compression molding of the first insulator layer 120, singulation of finished semiconductor packages or for other uses in other intermediate manufacturing processes such that the required clamping areas are located away from the delicate molded areas that contain the first and second conductor traces and interconnecting studs, thus ensuring that the subsequent processes do not damage the molded area.

Figure 2A:
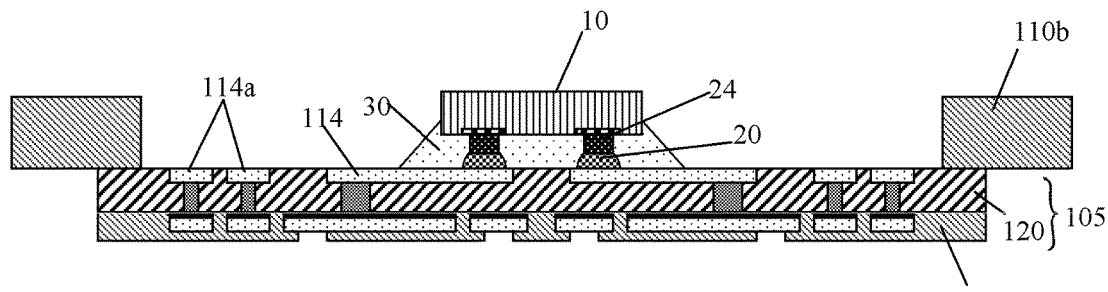
FIGS. 2A-2D, 3 and 4 illustrate methods for forming semiconductor packages using the multi-layer substrate shown in FIG. 1J.
Figure 2B:
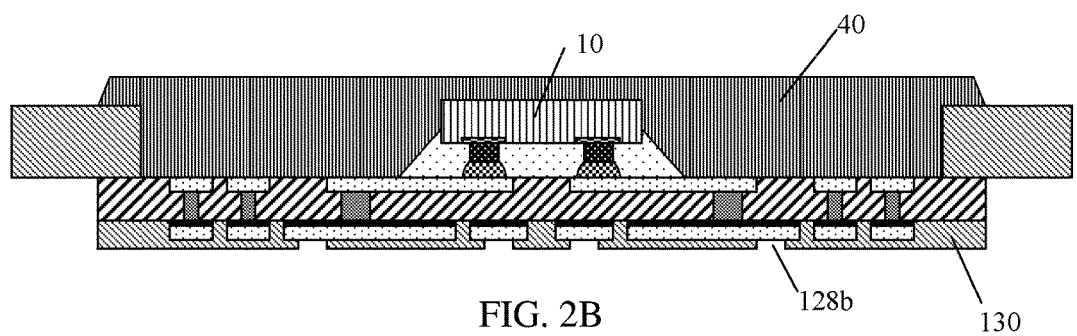
Figure 2C:
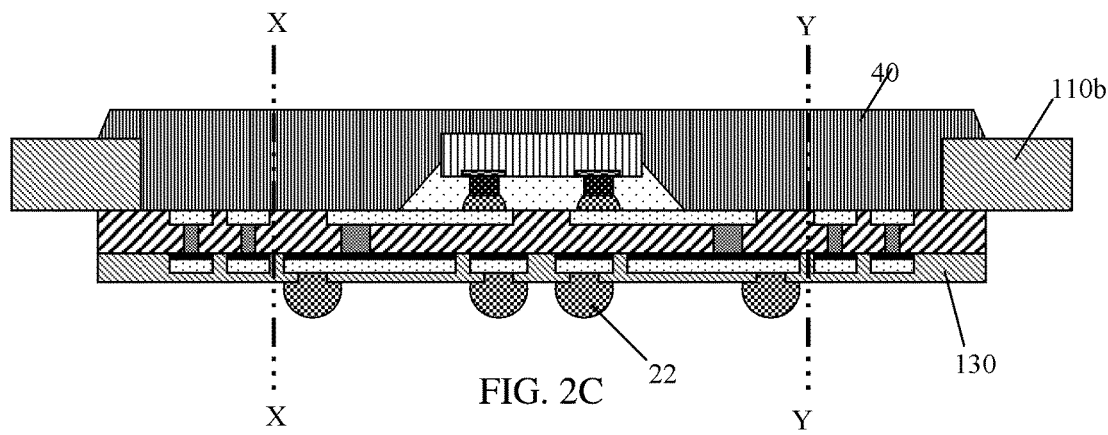
Figure 2D:
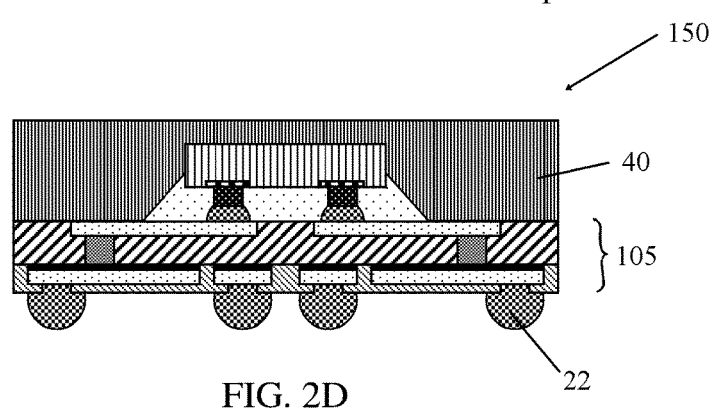

For simplicity of illustration, FIG. 2A shows the carrier ring 110b being formed around a molded first insulator layer 120. As shown in FIG. 2A, a semiconductor die 10 is connected to the first conductor layout 114a through solder bumps 20 and metal pillars 24 connections. Mounting of the die 10 is also strengthened by an underfill compound 30. In FIG. 2B, after the die 10 is mounted on the substrate 105, the entire die is encapsulated in a molding 40. Preferably, the molding 40 is made from a material having similar or identical properties with the material of the first insulator layer 120 to minimize stresses created due to property differences. Solder balls 22 may also be disposed in contact with the exposed second conductor layouts 128b for external electrical connection. In FIG. 2C, the encapsulated die is cut along singulation lines XX and YY to provide a finished semiconductor package 150 containing the substrate 105 obtained by the process 100 of the present invention.

Figure 3:
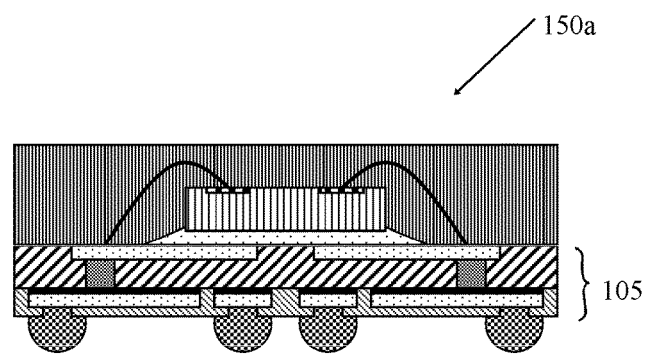
Figure 4:
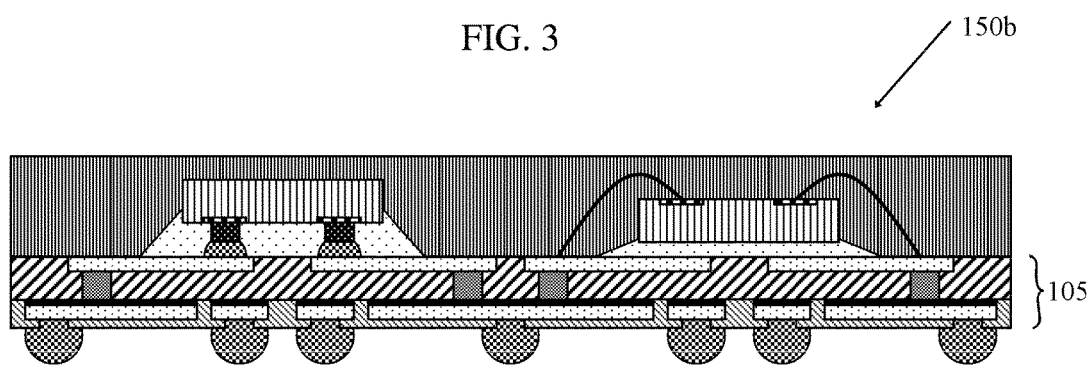

Instead of using solder bump connection, the die 10 may be wire-bonded to the first conductor layout 114a, as shown in FIG. 3, and another finished semiconductor package 150a containing the substrate 105 is obtained by the above process 100. Further, as shown in FIG. 4, a finished semiconductor package 150c may comprise two or more dies, passives or packages, including dies that are made using different semiconductor fabrication techniques.

Referring back to FIGS. 1J and 2C, around each first conductor layout 114a, some of the peripheral conductors 114b are not electrically connected to the rest of the first conductor layout 114a and are provided to control electroplating. For example, the conductors 114b may act as "current stealers" to change the current distribution during electroplating of the studs 118 and/or second conductor trace layer 128a to achieve uniform electroplating thickness. Alternatively, the conductors 114b are provided to change a stress distribution on the substrate 105 by changing the composite coefficient of thermal expansion (CTE) across the substrate area.

Figure 5:
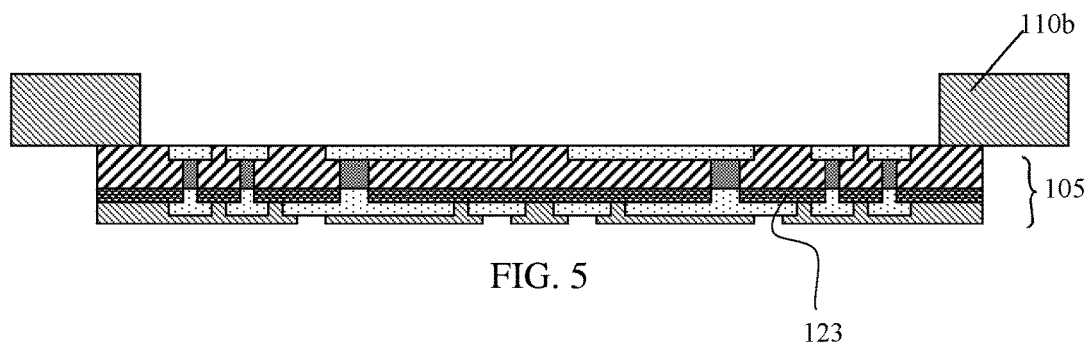
FIGS. 5 and 6 illustrate structures of a two-layer substrate according to another embodiment of the present invention.
Figure 6:
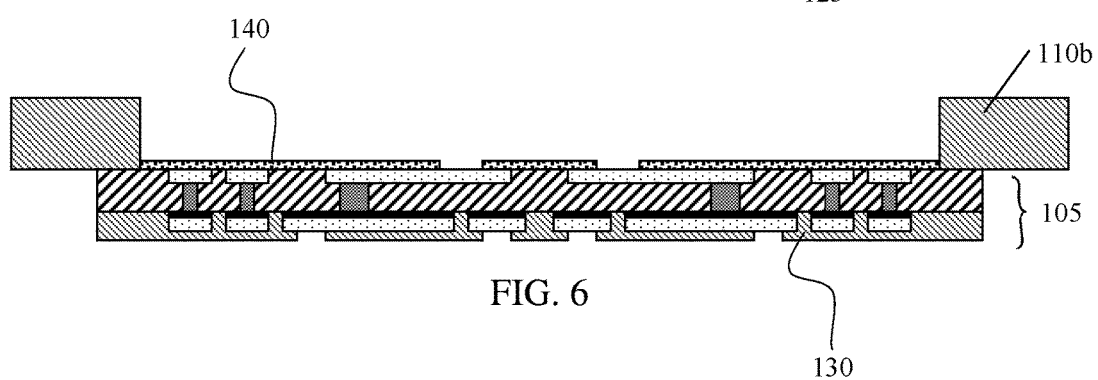

FIGS. 5 and 6 show variations in the structures of the above embodiments. For example, as shown in FIG. 5, before disposing the conductor seed layer 124, an adhesion layer 123 is applied on the ground surface 122 of the molded first insulator layer 120 to promote adhesion of the second conductor trace layer 128a. Preferably, the adhesion layer 123 is a polyimide or woven glass fiber laminate. In FIG. 6, a top surface of the substrate 105 is deposited with a soldermask 140 so that selected areas of the first conductor trace layer 114a are exposed for external electrical connection.

Figure 7A:
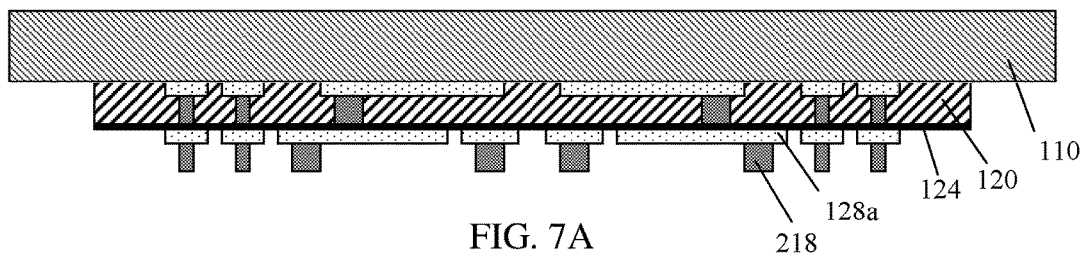
FIGS. 7A-7F illustrate structures of a three-layer substrate according to yet another embodiment of the present invention.
Figure 7B:
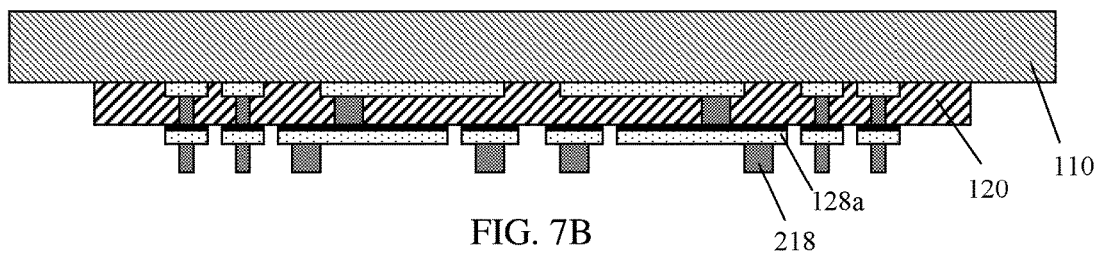

FIGS. 7A-7F show progressive buildup of a multi-layer substrate 105a comprising three conductor trace layers. FIG. 7A shows continued buildup of the structure of the semi-finished substrate shown in FIG. 1G. As shown in FIG. 7A, a second interconnect layer 218, comprising second conductor studs 218, is formed on the patterned second conductor trace layer 128a by photolithographic and electroplating processes. In FIG. 7B, the conductor seed layer 124 that are not built-up by the second conductor trace layer 128a is removed by chemical etching.

Figure 7C:
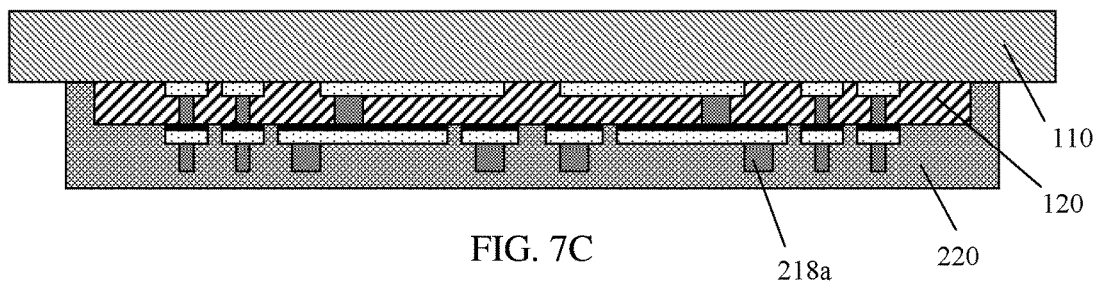
Figure 7D:
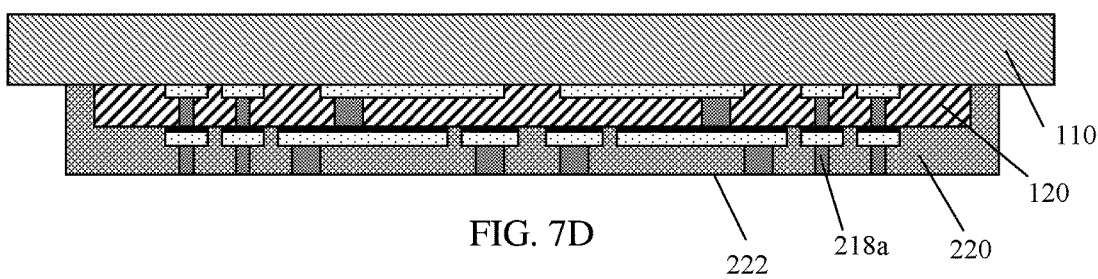

In FIG. 7C, the molded first insulator layer 120 on the semi-finished substrate is over-molded with a second insulator molding 220. As in the first insulator layer, the second insulator molding also contains a matrix of resin and embedded inorganic silica fillers. The second insulator molding 220 can be the same size as the first insulator molding 120. As shown in FIG. 7C, the second insulator molding 220 is larger and it encapsulates the first insulator molding 120 in a so-called molding-over-molding.

As in FIG. 1E, the free surface of the second insulator molding 220 is abrasively ground to provide a planar surface 222. The ground molding surface 222 also provides good adhesion for a second conductor seed layer 224 to be deposited and a third conductor trace layer 228a to be built-up. When the third conductor trace layer 228a is the outermost conductor trace layer of the finished substrate, the outermost conductor trace layer is sealed with a soldermask and selected areas of the outermost conductor trace layer are then exposed, as seen in FIG. 7F, for external electrical connection.

Figure 7E:
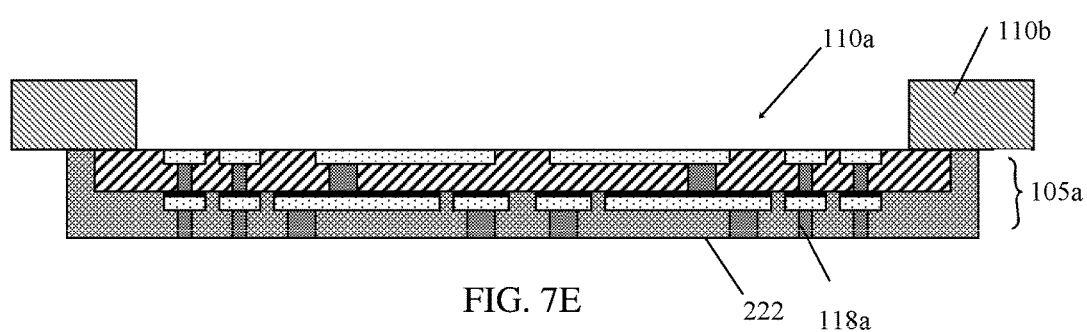

In FIG. 7E, it is shown that an internal portion of the carrier 110 is partially etched away to expose the first conductor trace layer 114a so that a reinforcement ring 110b remains on the substrate 105a before the processing on the substrate is completed. It is possible that the reinforcement ring 110b is formed after processing on the substrate 105a is completed. The resulting substrate 105a comprises a plurality of insulator layers adjoining to one another with each insulator layer having a corresponding (conductor elements) conductor trace layer and an interconnect layer embedded within. A dividing plane parallel to the contacting surfaces of the adjoining insulating layers lies in-between two insulator layers such that the conductor trace elements in one insulator layer does not cross over the dividing plane to the adjacent insulator layer. However, the conductor trace elements in each corresponding insulator layer are electrically connected to one another such that the top surface of the substrate 105a is electrically connected to the rear surface of the substrate. Specifically, the interconnect layer in one insulator layer is electrically and physically connected to the conductor trace layer of the adjoining insulating layer.

Figure 7F:
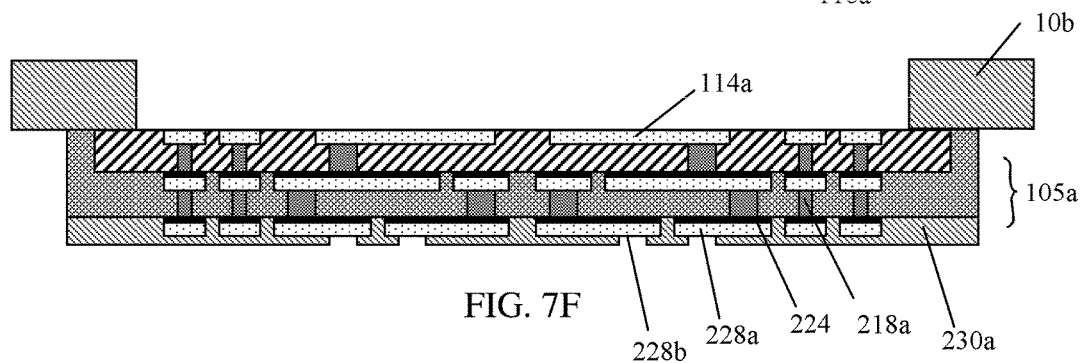

FIG. 8 shows a plan view of the substrate 105, 105a as seen from the top according to FIG. 1J or 7F. As seen in FIG. 8 through the opening 110a in the carrier 110, the first conductor trace layer 114a illustrates a gang of 9 conductor layouts 114a are encapsulated in a molding 120, 220. As described earlier, within each conductor layouts 114a, there are stand-alone conductors 114b that are provided as "current stealers" to adjust the current distribution during electroplating; in addition these stand-alone conductors 114b can be used to modify the composite coefficient of thermal expansion across the substrate to minimise any warpage due to thermal changes during processing. In the clamping zone around the substrate 105, 105a, that is, through the thickness of the reinforcement ring 110b, there are positioning or fiducial holes 160 and stress-relief slots 170.

The above drawings illustrate forming multi-layer substrate with 2 and 3 conductor trace layers. It is possible to obtain multi-layer substrate with more than 3 conductor trace layers by forming each additional built-up layer with a conductor trace layer and an interconnect stud layer and encapsulating these two component layers in a resin molding compound. With the present invention, the multi-layer substrates allow more complex interconnect routing to support packaging of new semiconductor chips. Advantageously, the multi-layer conductor traces can also be separately designated to carry different types of signal or power, for example, to reduce signal interference. As the feature sizes of the conductor layouts are not limited by the characters of etching, the multi-layer substrates according to the present invention also provide an advance in achieving circuit miniaturization.

While specific embodiments have been described and illustrated, it is understood that many changes, modifications, variations and combinations thereof could be made to the present invention without departing from the scope of the present invention. For example, it is possible to form a patterned via layer to connect a conductor trace layer with a conductor trace layer located two or more layers away in the built-up structure of the substrate; this feature will provide an additional level of interconnect routing that is not possible with conventional leadframes.

The invention claimed is:

1. A semiconductor substrate comprising:
   a first conductor trace layer;
   a second conductor trace layer;
   an interconnect stud layer disposed between the first and second conductor trace layers, wherein studs connect selected areas between the first and second conductor trace layers;
   a resin compound encapsulating the first conductor trace layer and the interconnect stud layer and being abrasively ground to expose the studs;
   an adhesion layer disposed on the ground surface of the resin compound, wherein the adhesion layer comprising polyimide or woven glass fiber; and
   a sacrificial carrier that is electrically conductive and chemically etchable, wherein an internal portion of the sacrificial carrier is etched away to expose the first conductor trace layer.

2. A semiconductor substrate according to claim 1, further comprising an insulating layer disposed on the second conductor trace layer, wherein the insulating layer exposes areas of the second conductor trace layer for external electrical connections.

3. A semiconductor substrate comprising:
   a first conductor trace layer;
   a second conductor trace layer;
   an interconnect layer disposed between the first and second conductor trace layers, wherein studs connect selected areas between the first and second conductor trace layers;
   a resin compound encapsulating the first conductor trace layer and the interconnect layer;
   an adhesion layer disposed between the resin compound and the second conductor trace layer to promote adhesion of the second conductor trace layer, wherein the adhesion layer comprising polyimide.

4. A semiconductor substrate according to claim 3, further comprising an insulating layer disposed on the second conductor trace layer, wherein the insulating layer exposes areas of the second conductor trace layer for external electrical connections.

5. A semiconductor substrate comprising:
   a first conductor trace layer;
   a second conductor trace layer;
   an interconnect layer disposed between the first and second conductor trace layers, wherein studs connect selected areas between the first and second conductor trace layers;
   a resin compound encapsulating the first conduct trace layer and the interconnect layer;
   a woven glass fiber laminate disposed between the resin compound and the second conductor trace layer.

6. A semiconductor substrate comprising:
   two or more intermediate built-up layers, wherein each intermediate built-up layer comprising a conductor trace component layer and an interconnect stud component layer encapsulated in a resin compound, the interconnect stud component layer of one built-up layer is connected to the conductor trace component layer of the adjacent built-up layer; and
   an adhesion layer disposed between each pair if built-up layers, wherein the adhesion layer comprising, polyimide or woven glass fiber.

* * * * *

UNITED STATES PATENT AND TRADEMARK OFFICE
CERTIFICATE OF CORRECTION

PATENT NO. : 10,446,457 B2
APPLICATION NO. : 16/032085
DATED : October 15, 2019
INVENTOR(S) : Shoa Siong Lim and Hwee Seng Chew Page 1 of 1

It is certified that error appears in the above-identified patent and that said Letters Patent is hereby corrected as shown below:

In the Claims

Column 8, Line 46, delete "if" and replace with "of"
Column 8, Line 47, delete second ","

Signed and Sealed this
Twenty-fourth Day of March, 2020

Andrei Iancu
*Director of the United States Patent and Trademark Office*